United States Patent
Shen et al.

(10) Patent No.: US 11,387,423 B2
(45) Date of Patent: Jul. 12, 2022

(54) NON-BLINKING QUANTUM DOT, PREPARATION METHOD THEREOF, AND QUANTUM DOT-BASED LIGHT-EMITTING DIODE

(71) Applicant: HENAN UNIVERSITY, Kaifeng (CN)

(72) Inventors: Huaibin Shen, Kaifeng (CN); Zuliang Du, Kaifeng (CN); Linsong Li, Kaifeng (CN); Shujie Wang, Kaifeng (CN); Yanbin Zhang, Kaifeng (CN)

(73) Assignee: HENAN UNIVERSITY, Kaifeng (CN)

( * ) Notice: Subject to any disclaimer, the term of this patent is extended or adjusted under 35 U.S.C. 154(b) by 266 days.

(21) Appl. No.: 16/829,520

(22) Filed: Mar. 25, 2020

(65) Prior Publication Data

US 2021/0305525 A1    Sep. 30, 2021

(51) Int. Cl.
| | |
|---|---|
| *H01L 51/50* | (2006.01) |
| *H01L 51/56* | (2006.01) |
| *H01L 51/00* | (2006.01) |
| *C09K 11/88* | (2006.01) |
| *H01L 51/52* | (2006.01) |

(52) U.S. Cl.
CPC ......... *H01L 51/502* (2013.01); *C09K 11/883* (2013.01); *H01L 51/0037* (2013.01); *H01L 51/0039* (2013.01); *H01L 51/0043* (2013.01); *H01L 51/56* (2013.01); *H01L 51/0003* (2013.01); *H01L 51/5056* (2013.01); *H01L 51/5072* (2013.01); *H01L 51/5088* (2013.01); *H01L 51/5221* (2013.01); *H01L 2251/301* (2013.01); *H01L 2251/558* (2013.01)

(58) Field of Classification Search
CPC .... H01L 51/502; C09K 11/883; C09K 11/565
See application file for complete search history.

(56) References Cited

FOREIGN PATENT DOCUMENTS

| CN | 106803546 A | 6/2017 |
| JP | 2012-102011 A | 5/2012 |
| KR | 10-2016-0093429 A | 8/2016 |

OTHER PUBLICATIONS

Talapin et al., "CdSe/CdS/ZnS and CdSe/ZnSe/ZnS Core-Shell-Shell Nanocrystals," J. Phys. Chem. B 2004, 108, 18826-18831, Sep. 17, 2022, 6 pages.
Aldeek et al., "Enhanced Optical Properties of Core/Shell/Shell CdTe/CdS/ZnO Quantum Dots Prepared in Aqueous Solution," J. Phys. Chem. C 2009, 113, 19458-19467, Sep. 22, 2009, 10 pages.
Reiss et al., "Low polydispersity core/shell nanocrystals of CdSe/ZnSe and CdSe/ZnSe/ZnS type: preparation and optical studies," Synthetic Metals 139 (2003) 649-652, 4 pages.
Fitzmorris et al., "Optical Properties and Exciton Dynamics of Alloyed Core/Shell/Shell Cd1_xZnxSe/ZnSe/ZnS Quantum Dots," Applied Materials and Interfaces, Mar. 7, 2013, 8 pages.

*Primary Examiner* — Anthony Ho
(74) *Attorney, Agent, or Firm* — Osha Bergman Watanabe & Burton LLP

(57) ABSTRACT

A non-blinking quantum dot (NBQD) is provided. In a light-emitting diode (LED) prepared with the NBQD, the maximum red brightness is greater than 180,000 cd/m$^2$, the green brightness is greater than 200,000 cd/m$^2$, and the blue brightness is greater than 100,000,000 cd/m$^2$. The red current efficiency is 15-40 cd/A, the green current efficiency is 90-150 cd/A, and the blue current efficiency is 1-20 cd/A. The red external quantum efficiency is 18-30%, the green external quantum efficiency is 18-30%, and the blue external quantum efficiency is 6-22%. When the current efficiency or external quantum efficiency is the highest, the red, green and blue brightness of the LED is 70,000-100,000 cd/m$^2$, 70,000-200,000 cd/m$^2$ and 3,000-40,000 cd/m$^2$, respectively.

8 Claims, 2 Drawing Sheets

NON-BLINKING QUANTUM DOT, PREPARATION METHOD THEREOF, AND QUANTUM DOT-BASED LIGHT-EMITTING DIODE

TECHNICAL FIELD

The present invention relates to the technical field of electroluminescent quantum dots (EL QDs), and in particular, to a non-blinking quantum dot (NBQD), a preparation method thereof, and a quantum dot-based light-emitting diode (QDLED).

BACKGROUND

Fluorescent QDs, especially group II-VI semiconductor nanoparticles, have been the focus of research in recent years. The size of QDs can be adjusted to generate fluorescence with different wavelengths. Therefore, the potential applications of QDs have attracted wider attention in biomolecule labeling and immunodetection, light emitting diodes, lasers and solar cells, etc. Single QDs will blink when they are continuously excited. That is, their fluorescence will randomly switch between bright and dark states (suddenly bright and dark) under continuous excitation, which seriously affects the effect of the QDs in practical applications. During biological detection, the blinking of fluorescent QDs may cause the tracking target to be lost. In the application of electroluminescent devices, the blinking QDs may reduce the efficiency of the devices and cause unstable luminescence. For this reason, a single QD can be prepared into a core-shell structure to improve the stability of the QD by the shell layer.

Fluorescent quantum dot-based light-emitting diodes (QLEDs) have good application prospects in the lighting field due to their advantages such as good luminous intensity, good color purity and low cost. At present, the efficiency of red, green and blue (RGB) QD-based light-emitting devices has reached about 20%, and the maximum brightness of red and green has reached more than 100,000 $cd/m^2$. However, in the lighting application, the RGB QD-based light-emitting devices face the key problems of low blue brightness, and low blue, green and red (BGR) brightness under high efficiency. For example, in the lighting application, the brightness is required to reach thousands of candela per square meter under high efficiency. However, the maximum blue brightness is less than 20,000 $cd/m^2$, and the BGR brightness is less than 2,000 $cd/m^2$ under the highest efficiency. Therefore, the current QLEDs cannot satisfy the application in the lighting field.

SUMMARY

One or more embodiments of the present invention provide a non-blinking quantum dot (NBQD), a preparation method thereof, and a quantum dot-based light-emitting diode (QDLED), which can satisfy the application in the lighting field.

One or more embodiments of the present invention provide the following technical solutions.

One or more embodiments of the present invention provide an NBQD, including a core, an inner shell layer covering a surface of the core, and an outer shell layer covering a surface of the inner shell layer, where the core is formed of CdSe or $Cd_mZn_{1-m}Se$, $0<m<1$;

the inner shell layer is formed of ZnSe, and the outer shell layer is formed of ZnS or ZnO.

Preferably, the core has a particle size of 2.5-6.0 nm; the inner shell layer has a thickness of 0.32-4.8 nm; the outer shell layer has a thickness of 0.31-1.24 nm.

Preferably, the NBQD is CdSe@xZnSe-yZnS, CdSe@xZnSe-yZnO, $Cd_mZn_{1-m}Se$@xZnSe-yZnS, or $Cd_mZn_{1-m}Se$@xZnSe-yZnO;

where, x is a number of layers, $1<x<15$, and y is a number of layers, $0<y<4$.

One or more embodiments of the present invention further provide a preparation method of the NBQD, including the following steps:

providing a dispersion agent of a core material, a dispersion agent of a material source of an inner shell layer and a dispersion agent of a material source of an outer shell layer, where the core material includes CdSe or $Cd_mZn_{1-m}Se$, $0<m<1$; the material source of the inner shell layer is a mixture of a zinc source and a selenium source; the material source of the outer shell layer is a mixture of a zinc source and a sulfur source, or a zinc oxide source;

adding the dispersion agent of the material source of the inner shell layer dropwise to the dispersion agent of the core material at a rate of 1-20 mL/h under an anaerobic condition, so that a material of the inner shell layer is grown in situ on a surface of the core material to obtain a dispersion agent of an intermediate, where the intermediate includes a core and an inner shell layer covering a surface of the core; and adding the dispersion agent of the material source of the outer shell layer dropwise to the dispersion agent of the intermediate at a rate of 1-20 mL/h under an anaerobic condition, so that a material of the outer shell layer is grown in situ on a surface of the intermediate, to obtain an NBQD.

Preferably, the growth temperature of the material of the inner shell layer and the material of the outer shell layer is 240-350° C., and the growth time of the material of the inner shell layer and the material of the outer shell layer is 1-5 h.

One or more embodiments of the present invention provide a QDLED, including a substrate, a bottom electrode, a hole injection layer, a hole transport layer, an NBQD light-emitting layer, an electron transport layer and a top electrode which are sequentially stacked;

or a substrate, a bottom electrode, an electron transport layer, an NBQD light-emitting layer, a hole transport layer, a hole injection layer and a top electrode which are sequentially stacked;

where, the NBQD light-emitting layer is formed of an NBQD, and the NBQD is the above NBQD or an NBQD prepared by the above preparation method.

Preferably, the hole injection layer is prepared from poly(3,4-ethylenedioxythiophene): polystyrene sulfonate, dimethylsulfoxide-doped poly(3,4-ethylenedioxythiophene): polystyrene sulfonate, graphene-doped poly(3,4-ethylenedioxythiophene): polystyrene sulfonate, or sorbitol-doped poly(3,4-ethylenedioxythiophene): polystyrene sulfonate.

Preferably, the hole transport layer is prepared from one or more of poly(N,N'-bis(4-butylphenyl)-N,N'-bis(phenyl) benzidine), poly[(9,9-dioctylfluorene-2,7-diyl)-co-(4,4'-(N-(4-sec-butylphenyl)diphenylamine], poly(9-vinylcarbazole), tris(4-carbazole-9-ylphenyl)amine, 4,4'-bis(9-carbazole)biphenyl, N,N'-bis-(1-naphthyl)-N,N'-diphenyl-1,1'-biphenyl-4,4'-diamine, m-xylylenedicarbazole, $MoO_3$, NiO, $V_2O_5$ and $WO_3$.

Preferably, the electron transport layer is prepared from one or more of ZnO, SnO, $TiO_2$, $ZrO_2$, Li, Al, Mg, Cs, In, Ga, Zr and 8-hydroxyquinoline aluminum.

Preferably, the top electrode is prepared from Al, Ag or Au.

One or more embodiments of the present invention provide an NBQD, including a core, an inner shell layer covering a surface of the core, and an outer shell layer covering a surface of the inner shell layer, where the core is formed of CdSe or $Cd_mZn_{1-m}Se$, 0<m<1; the inner shell layer is formed of ZnSe, and the outer shell layer is formed of ZnS or ZnO. In One or more embodiments, the NBQD has a double-layer exciton confining layer. Although ZnSe as a shell layer can obtain a non-blinking core-shell QD, its ability to confine a hole is weak, so blinking occurs under strong excitation light. To solve this problem, an outer shell layer is added, which improves the non-blinking property of the core-shell QD under strong excitation light and improves the stability of the QD. The outer shell layer can confine an electron and a hole, and confine an exciton to emit light inside the QD, increasing the quantum yield. In addition, compared with ZnSe, the outer shell layer is environment-tolerant, and its surface is more stable and less prone to damage during application.

One or more embodiments of the present invention further provide a method for preparing the NBQD. The preparation method adds a shell layer material dropwise to a core material solution under an anaerobic condition to reduce an intercrystalline defect. The preparation method prepares the shell layers in difference steps to obtain a double-layer exciton confining layer, which provides a necessary foundation for the preparation of the NBQD.

One or more embodiments of the present invention further provide a light-emitting diode (LED). The NBQD layer matches with an energy level of a carrier transport layer in other device structures in the diode, so as to balance the carrier injection and improve the efficiency of carrier injection. According to the embodiments, in the LED, the maximum red brightness is greater than 180,000 cd/m$^2$, the green brightness is greater than 200,000 cd/m$^2$, and the blue brightness is greater than 100,000,000 cd/m$^2$. The red current efficiency is 15-40 cd/A, the green current efficiency is 90-150 cd/A, and the blue current efficiency is 1-20 cd/A. The red external quantum efficiency is 18-30%, the green external quantum efficiency is 18-30%, and the blue external quantum efficiency is 6-22%. When the current efficiency or external quantum efficiency is the highest, the red, green and blue brightness of the LED is 7,000-100,000 cd/m$^2$, 7,000-200,000 cd/m$^2$, and 3,000-40,000 cd/m$^2$, respectively.

DETAILED DESCRIPTION

Figure 1:
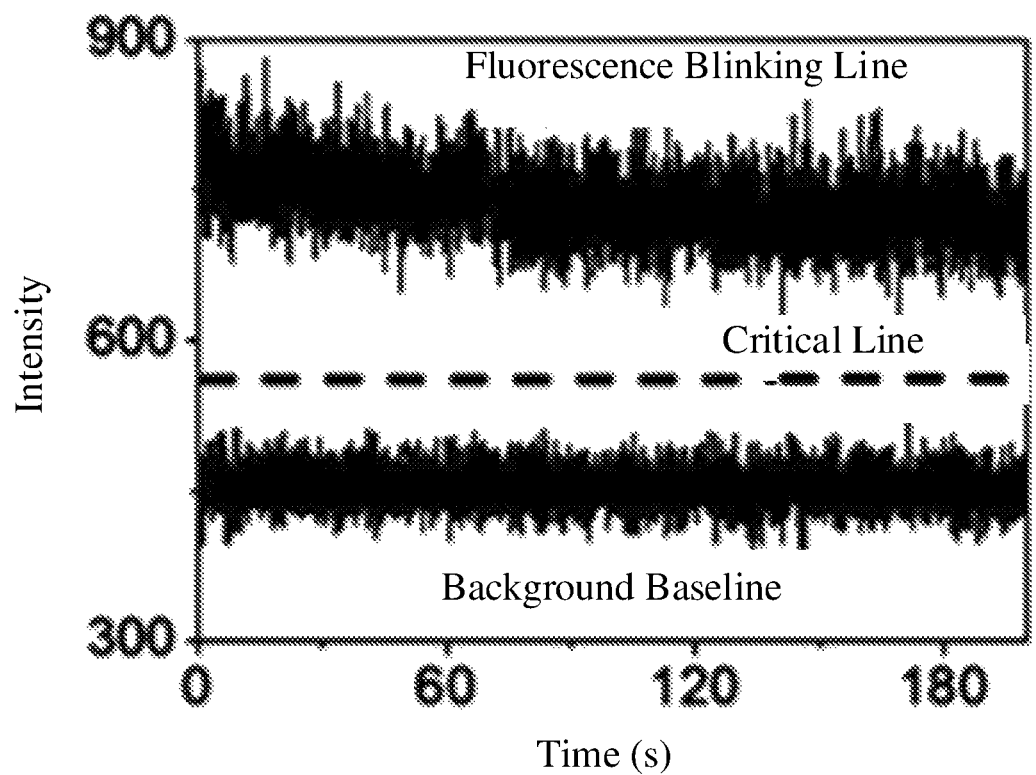
FIG. 1 is a diagram showing a fluorescent test result of a quantum dot-based light-emitting diode (QDLED) prepared in Embodiment 1.

One or more embodiments of the present invention provide an NBQD, including a core, an inner shell layer covering a surface of the core, and an outer shell layer covering a surface of the inner shell layer, where the core is formed of CdSe or $Cd_mZn_{1-m}Se$, 0<m<1;

the inner shell layer is formed of ZnSe, and the outer shell layer is formed of ZnS or ZnO.

In One or more embodiments, the NBQD includes a core. The core is formed of CdSe or $Cd_mZn_{1-m}Se$, where 0<m<1, preferably 0.2<m<0.8, and more preferably 0.4<m<0.6. The core has a particle size of preferably 2.5-6 nm, more preferably 2.7-5.5 nm, and most preferably 3.0-5.0 nm.

In one or more embodiments of the present invention, the NB QD further includes an inner shell layer covering a surface of the core. The inner shell layer is formed of ZnSe. The inner shell layer has a thickness of preferably 0.32-4.8 nm, more preferably 1.0-4.0 nm, and most preferably 2.0-3.0 nm.

In one or more embodiments of the present invention, the NB QD further includes an outer shell layer covering a surface of the core. The outer shell layer is formed of ZnS or ZnO. The outer shell layer has a thickness of preferably 0.31-1.24 nm, more preferably 0.4-1.1 nm, and most preferably 0.6-0.8 nm.

In one or more embodiments of the present invention, the NBQD is preferably CdSe@xZnSe-yZnS, CdSe@xZnSe-yZnO, $Cd_mZn_{1-m}$Se@xZnSe-yZnS, or $Cd_mZn_{1-m}$Se@xZnSe-yZnO. The x is a number of layers, preferably 1<x<15, more preferably 3<x<12, and most preferably 6<x<8. The y is a number of layers, preferably 0<y<4, and more preferably 1<y<3.

In one or more embodiments of the present invention, one of the layers has a bond length of a Zn—S ion pair, a bond length of a Zn—O ion pair, or a bond length of a Zn—Se ion pair.

One or more embodiments of the present invention further provide a preparation method of the NBQD, including the following steps:

provide a dispersion agent of a core material, a dispersion agent of a material source of an inner shell layer and a dispersion agent of a material source of an outer shell layer, where the core material includes CdSe or $Cd_mZn_{1-m}Se$, 0<m<1; the material source of the inner shell layer is a mixture of a zinc source and a selenium source; the material source of the outer shell layer is a mixture of a zinc source and a sulfur source, or a zinc oxide source;

add the dispersion agent of the material source of the inner shell layer dropwise to the dispersion agent of the core material at a rate of 1-20 mL/h under an anaerobic condition, so that a material of the inner shell layer is grown in situ on a surface of the core material to obtain a dispersion agent of an intermediate, where the intermediate includes a core and an inner shell layer covering a surface of the core; and add the dispersion agent of the material source of the outer shell layer dropwise to the dispersion agent of the intermediate at a rate of 1-20 mL/h under an anaerobic condition, so that a material of the outer shell layer is grown in situ on a surface of the intermediate, to obtain an NBQD.

One or more embodiments of the present invention provide a dispersion agent of a core material, a dispersion agent of a material source of an inner shell layer and a dispersion agent of a material source of an outer shell layer, where the core material includes CdSe or $Cd_mZn_{1-m}Se$, 0<m<1; the material source of the inner shell layer is a mixture of a zinc source and a selenium source; the material source of the outer shell layer is a mixture of a zinc source and a sulfur source, or a zinc oxide source.

In one or more embodiments of the present invention, the core material includes CdSe or $Cd_mZn_{1-m}Se$, where 0<m<1. The core material has a particle size of preferably 2.5-6 nm, more preferably 2.7-5.5 nm, and most preferably 3.0-5.0 nm. The core material is specifically CdSe, CdS, $Cd_{0.5}Zn_{0.5}Se$ or $CdSe_{0.2}S_{0.8}$. The present invention has no special requirement on the source of the core material, and a commercially available product well known to those skilled in the art can be used.

In one or more embodiments of the present invention, the core material in the dispersion agent of the core material has a concentration of preferably $1.5$-$3.0\times10^{-4}$ mmol/L, and more preferably $1.6$-$1.8\times10^{-4}$ mmol/L.

In one or more embodiments of the present invention, the material source of the inner shell layer is a mixture of a zinc source and a selenium source. The zinc source is preferably one or more of zinc chloride, zinc nitrate, zinc oleate, zinc stearate, zinc caprate, zinc laurate, zinc myristate, zinc eicosate, and zinc lignocerate. When the zinc source is two or more of the above specific substances, the present invention has no special limit on the ratio of the specific substances. The selenium source is preferably elemental selenium, and more preferably selenium powder. The present invention has no special requirement on the particle size of the selenium powder, and a particle size well known to those skilled in the art can be used.

In one or more embodiments of the present invention, the zinc source is calculated based on a zinc ion, the selenium source is calculated based on a selenium atom, and a molar ratio of the zinc source to the selenium source is preferably (1-5):1, and more preferably (2-4):1. The zinc source is calculated based on a zinc ion, the selenium source is calculated based on a selenium atom, and a concentration of the zinc source and the selenium source each in the dispersion agent of the material source of the inner shell layer is preferably 0.01-0.5 mmol/mL, more preferably 0.1-0.4 mmol/mL, and most preferably 0.2-0.3 mmol/mL.

In one or more embodiments, the material source of the outer shell layer is a mixture of a zinc source and a sulfur source, or a zinc oxide source. The zinc source is preferably one or more of zinc chloride, zinc nitrate, zinc oleate, zinc stearate, zinc caprate, zinc laurate, zinc myristate, zinc eicosate, and zinc lignocerate. When the zinc source is two or more of the above specific substances, the present invention has no special limit on the ratio of the specific substances. The sulfur source is preferably octadecancthiol. The present invention has no special requirement on the source of the octadecancthiol, and a source well known to those skilled in the art can be used. The selenium source is preferably zinc acetylacetonate. The present invention has no special requirement on the source of the zinc acetylacetonate, and a source well known to those skilled in the art can be used.

In one or more embodiments, when the material source of the outer shell layer is a mixture of a zinc source and a sulfur source, the zinc source is calculated based on a zinc ion, and the zinc source in the dispersion agent of the material source of the outer shell layer has a concentration of preferably 0.01-0.5 mmol/mL, more preferably 0.1-0.4 mmol/mL, and most preferably 0.2-0.3 mmol/mL. The zinc source and the sulfur source have a volume ratio of preferably (0.5-50):1, more preferably (10-40):1, and most preferably (20 to 30):1.

In one or more embodiments, when the source material of the outer shell layer is a zinc oxide source, the zinc oxide source in the dispersion agent of the material source of the outer shell layer has a concentration of preferably 0.01-0.6 mmol/mL, and more preferably 0.1-0.3 mmol/mL.

In one or more embodiments, a solvent in the dispersion agent of the core material, the dispersion agent of the material source of the inner shell layer and the dispersion agent of the material source of the outer shell layer each preferably includes one or more of oleylamine, liquid paraffin, octadecene, eicosane tetracosane and mineral oil. When the solvent is a mixture of a plurality of components, the solvent is preferably formulated according to an equal volume ratio of the components.

In one or more embodiments, the dispersion agent of the material source of the inner shell layer dropwise is added to the dispersion agent of the core material at a rate of 1-20 mL/h under an anaerobic condition, so that a material of the inner shell layer is grown in situ on a surface of the core material to obtain a dispersion agent of an intermediate, where the intermediate includes a core and an inner shell layer covering a surface of the core.

In one or more embodiments, the dropwise addition rate of the dispersion agent of the material source of the inner shell layer to the dispersion agent of the core material is 1-20 mL/h, preferably 5-15 mL/h, and more preferably 8-12 mL/h. The temperature of a reaction system during dropwise addition is preferably 240-350° C., more preferably 280-324° C., and most preferably 300-320° C. The temperature of the material of the inner shell layer grown in situ on the surface of the core material is the same as the temperature of the reaction system during dropwise addition.

In one or more embodiments, the temperature of the reaction system is preferably achieved by a uniform heating rate, and the heating rate is preferably 10-25° C./min, more preferably 12-22° C./min, and most preferably 15-18° C./min In one or more embodiments, the heating rate is limited as described above to prevent a component of the dispersion agent of the core material from being lost due to uneven heating and boiling, thereby improving the addition accuracy of the raw material. The present invention has no special limit on the specific heating process, as long as the control of the above temperature condition can be achieved. The dispersion agent of the material source of the inner shell layer dropwise is added to the dispersion agent of the core material, so as to prevent the material of the inner shell layer from forming the core alone.

In one or more embodiments, the growth time of the material of the inner shell layer is a time period from the completion of the addition of the dispersion agent of the material source of the inner shell layer to the stopping of the reaction. The growth time of the material of the inner shell layer is 1-5 h, preferably 2-4 h.

In one or more embodiments, the anaerobic condition is preferably a nitrogen protection condition.

After obtaining the dispersion agent of the intermediate, the dispersion agent of the material source of the outer shell layer dropwise is added to the dispersion agent of the intermediate at a rate of 1-20 mL/h under an anaerobic condition, so that a material of the outer shell layer is grown in situ on a surface of the intermediate, to obtain an NBQD. In one or more embodiments, the dropwise addition rate of the dispersion agent of the material source of the outer shell layer to the dispersion agent of the intermediate is 1-20 mL/h, preferably 5-15 mL/h, and more preferably 8-12 mL/h.

The temperature of a reaction system during dropwise addition is preferably 240-350° C., more preferably 280-324° C., and most preferably 300-320° C. The temperature of the material of the outer shell layer grown in situ on the surface of the intermediate is the same as the temperature of the reaction system during dropwise addition.

In one or more embodiments, the temperature of the reaction system is preferably achieved by a uniform heating rate, and the heating rate is preferably 10-25° C./min, more preferably 12-22° C./min, and most preferably 15-18° C./min one or more embodiments limit the heating rate as described above to prevent a component of the dispersion agent of the intermediate from being lost due to uneven heating and boiling, thereby improving the addition accuracy of the raw material. The present invention has no special limit on the specific heating process, as long as the control of the above temperature condition can be achieved. one or more embodiments add the dispersion agent of the material source of the outer shell layer dropwise to the dispersion agent of the intermediate, so as to prevent the material of the outer shell layer from forming the core alone.

In one or more embodiments, the growth time of the material of the outer shell layer is a time period from the completion of the addition of the dispersion agent of the material source of the outer shell layer to the stopping of the reaction. The growth time of the material of the outer shell layer is 1-5 h, preferably 2-4 h.

One or more embodiments further provide a quantum dot-based light-emitting diode (QDLED), including a substrate, a bottom electrode, a hole injection layer, a hole transport layer, an NBQD light-emitting layer, an electron transport layer and a top electrode which are sequentially stacked;

or a substrate, a bottom electrode, an electron transport layer, an NBQD light-emitting layer, a hole transport layer, a hole injection layer and a top electrode which are sequentially stacked;

where, the NBQD light-emitting layer is formed of an NBQD, and the NBQD is one as described in the above technical solution.

In one or more embodiments, the substrate is preferably a transparent glass or a transparent plastic. The present invention has no special limit on the thickness of the substrate, and a thickness well known to those skilled in the art can be used.

In one or more embodiments, the bottom electrode is preferably an indium tin oxide (ITO) bottom electrode, and the thickness of the bottom electrode is preferably 50-150 nm, more preferably 80-120 nm, and most preferably 90-110 nm.

In one or more embodiments, the hole injection layer is preferably prepared from poly(3,4-ethylenedioxythiophene): polystyrene sulfonate, dimethylsulfoxide-doped poly(3,4-ethylenedioxythiophene): polystyrene sulfonate, graphene-doped poly(3,4-ethylenedioxythiophene): polystyrene sulfonate, or sorbitol-doped poly(3,4-ethylenedioxythiophene): polystyrene sulfonate. The hole injected layer may have a thickness of preferably 20-60 nm, more preferably 30-50 nm, and most preferably 35-45 nm.

In one or more embodiments, the hole injection layer provides a hole, and the hole is injected into the QD light-emitting layer under light excitation.

In one or more embodiments, the hole transport layer is preferably prepared from one or more of poly(N,N'-bis(4-butylphenyl)-N,N'-bis(phenyl)benzidine), poly[(9,9-dioctylfluorene-2,7-diyl)-co-(4,4'-(N-(4-sec-butylphenyl)diphenylamine], poly(9-vinylcarbazole), tris(4-carbazole-9-ylphenyl)amine, 4,4'-bis(9-carbazole)biphenyl, N,N'-bis-(1-naphthyl)-N,N'-diphenyl-1,1'-biphenyl-4,4'-diamine, m-xylylenedicarbazole, $MoO_3$, NiO, $V_2O_5$ and $WO_3$. When the hole transport layer is prepared from two or more of the above specific raw materials, the present invention has no special limit on a ratio of the specific raw materials for preparing the hole transport layer, and any ratio may be used. In one or more embodiments, the hole transport layer has a thickness of preferably 10-50 nm, more preferably 20-40 nm, and most preferably 25-35 nm.

In one or more embodiments, due to the hole transport layer, an energy level of the hole injection layer matches with an energy level of the QD light-emitting layer, which helps the hole injection layer to inject the hole into the quantum light-emitting layer.

In one or more embodiments, the NBQD light-emitting layer is formed of an NBQD, which is preferably one or more of the NBQD described in the above technical solution. When the NBQD light-emitting layer is prepared from two or more of the above specific materials, the present invention has no special limit on a ratio of the specific materials for preparing the NBQD light-emitting layer, and any ratio can be used. The NBQD light-emitting layer has a thickness of preferably 5-50 nm, more preferably 10-40 nm, and most preferably 20-30 nm.

In one or more embodiments, the electron transport layer is preferably prepared from one or more of ZnO, SnO, $TiO_2$, $ZrO_2$, Li, Al, Mg, Cs, In, Ga, Zr and 8-hydroxyquinoline aluminum. When the electron transport layer is prepared from two or more of the above specific raw materials, the present invention has no special limit on a ratio of the specific raw materials for preparing the electron transport layer, and any ratio may be used. In one or more embodiments, the electron transport layer has a thickness of preferably 20-100 nm, more preferably 40-80 nm, and most preferably 50-60 nm.

In one or more embodiments, the electron transport layer provides an electron for the QD light-emitting layer, and the electron finally meets with the hole on the QD light-emitting layer to emit light.

In one or more embodiments, the top electrode is preferably prepared from Al, Ag or Au, and the thickness of the top electrode is preferably 50-150 nm, more preferably 80-120 nm, and most preferably 90-110 nm.

One or more embodiments further provide a preparation method of the QDLED, including the following steps:

sequentially spin-coat a raw material for preparing a hole injection layer, a raw material for preparing a hole transport layer, a raw material for preparing an NBQD light-emitting layer and a raw material for preparing an electron transport layer, or a raw material for preparing an electron transport layer, a raw material for preparing an NBQD light-emitting layer, a raw material for preparing a hole transport layer and a raw material for preparing a hole injection layer on a substrate with a bottom electrode layer according to the structure of the above QD light-emitting diode; and deposit a raw material for preparing a top electrode to obtain a QDLED.

In one or more embodiments, the substrate with the bottom electrode layer is preferably pretreated before use, and the pretreatment preferably includes cleaning and ultraviolet-ozone treatment. The present invention has no special limit on the cleaning, and a cleaning process well known to those skilled in the art can be used as long as a cleaning purpose is achieved. The time of the UV-ozone treatment is preferably 10-20 min, more preferably 12-18 min, and most preferably 14-16 min. The present invention has no special limit on the specific process of the ultraviolet-ozone treatment, and an ultraviolet-ozone treatment process well known to those skilled in the art can be used.

In one or more embodiments, the rate of spin-coating the raw materials for preparing the various layers is preferably 200-400 rpm, more preferably 250-350 rpm, and most preferably 280-320 rpm. In one or more embodiments, after the spin-coating of each layer is completed, drying treatment is preferably performed. The drying temperature is preferably 140-160° C., more preferably 145-155° C., and most preferably 148-152° C. The drying time is preferably 10-20 min, more preferably 12-18 min, and most preferably 14-16 min.

In one or more embodiments, the deposition is preferably vacuum deposition, and the rate of the vacuum deposition is preferably 1-3 Å/s, more preferably 2 Å/s.

EXAMPLE EMBODIMENTS

The NBQD, the preparation method thereof, and the QD-based light-emitting diode (QDLED) are described in detail below with reference to the embodiments, but the protection scope of the present invention is not limited thereto.

Embodiment 1

Preparation of CdSe@8ZnSe-2ZnS:

add a $2\times10^{-7}$ mmol CdSe QD with a particle size of 2.7 nm to a mixed solution of 6 mL octadecene and 6 mL oleylamine to obtain a CdSe QD solution;

increase the temperature to 310° C. at a rate of 18° C./min under nitrogen protection; add 8 mL of liquid paraffin solution composed of zinc oleate and selenium powder dropwise to the CdSe QD solution at a rate of 4 mL/h, where the zinc oleate has a concentration of 0.1 mmol/mL, and zinc in the zinc oleate and the selenium powder have a molar ratio of 1:1; perform a reaction for 1 h after the dropwise addition, to obtain an intermediate solution; and add 5 mL of octadecene solution composed of zinc oleate with a concentration of 0.1 mmol/mL and 2 mL of octadecene solution composed of octadecancthiol to the intermediate solution at a rate of 3 mL/h; perform a reaction for 2 h after the dropwise addition, to obtain an NBQD solution.

Preparation of QDLED:

treat a cleaned ITO glass substrate with an UV-ozone treatment device for 15 min; spin-coat 40 nm thick poly(3,4-ethylenedioxythiophene): polystyrene sulfonate as a hole injection layer on an upper surface of the ITO glass substrate at a rate of 300 rpm/min, and dry at 150° C. for 15 min; spin-coat 30 nm thick poly[(9,9-dioctylfluorene-2,7-diyl)-co-(4,4'-(N-(4-sec-butylphenyl)diphenylamine] as a hole transport layer on an upper surface of the hole injection layer at a rate of 300 rpm/min, and dry at 150° C. for 15 min; spin-coat a 40 nm thick CdSe@8ZnSe/2ZnS NBQD as an NBQD light-emitting layer on an upper surface of the hole transport layer at a rate of 2,000 rpm/min, and dry at 150° C. for 15 min; spin-coat a 55 nm thick zinc oxide as an electron transport layer on an upper surface of the NBQD light-emitting layer at a rate of 3,000 rpm/min; deposit 100 nm thick Al as a top electrode under vacuum on an upper surface of the electron transport layer at a rate of 3 Å/s, to obtain a QDLED.

FIG. 1 is a diagram showing a fluorescent test result of the QDLED. It can be seen from the figure that a middle dashed line is a critical line of a fluorescence blinking bright state line and the substrate, and the fluorescence blinking line is basically above the critical line. This indicates that the QDLED obtained in this embodiment has a stable fluorescence property.

Figure 2:
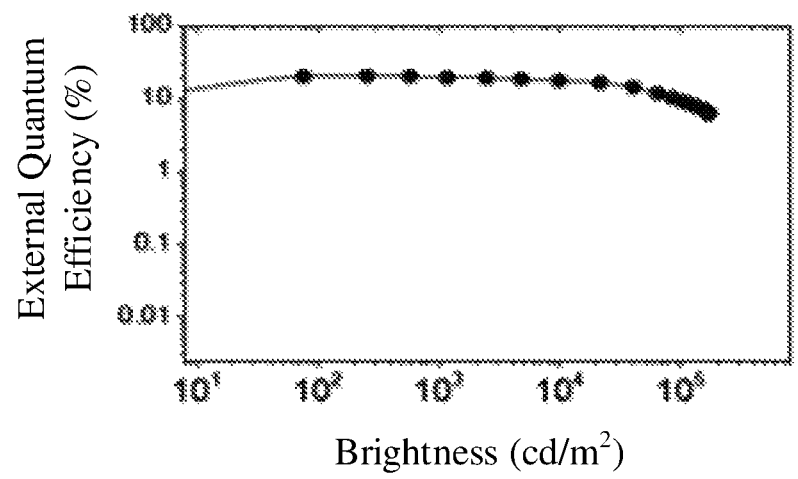
FIG. 2 is a diagram showing a red fluorescence property of a QDLED prepared in Embodiment 1.

FIG. 2 is a diagram showing a fluorescence property of the QDLED. It can be seen from the figure that the maximum red brightness of the QDLED is 180,000 cd/m², the maximum external quantum efficiency is 21%, and when the external quantum efficiency is above 19%, the corresponding brightness is 40-90,000 cd/m².

Embodiment 2

Preparation of CdSe@7ZnSe-1ZnO:

add a $2\times10^{-7}$ mmol CdSe QD with a particle size of 2.7 nm to a mixed solution of 6 mL octadecene and 6 mL oleylamine to obtain a CdSe QD solution; increase the temperature to 310° C. at a rate of 18° C./min under nitrogen protection; add 7 mL of 0.1 solution composed of zinc oleate and selenium powder dropwise to the CdSe QD solution at a rate of 4 mL/h, where zinc in the zinc oleate and the selenium powder have a molar ratio of 1:1; perform a reaction for 1 h after the dropwise addition, to obtain an intermediate solution; and add 2 mL of liquid paraffin solution composed of zinc oleate with a concentration of 0.2 mmol/mL and 1 mL of octadecene solution composed of octadecancthiol to the intermediate solution at a rate of 3 mL/h; perform a reaction for 1 h after the dropwise addition, to obtain an NBQD solution.

Preparation of QDLED:

treat a cleaned ITO glass substrate with an UV-ozone treatment device for 15 min; spin-coat 40 nm thick poly(3,4-ethylenedioxythiophene): polystyrene sulfonate as a hole injection layer on an upper surface of the ITO glass substrate at a rate of 3,000 rpm/min, and dry at 150° C. for 15 min; spin-coat 30 nm thick poly[(9,9-dioctylfluorene-2,7-diyl)-co-(4,4'-(N-(4-sec-butylphenyl)diphenylamine] as a hole transport layer on an upper surface of the hole injection layer at a rate of 300 rpm/min, and dry at 150° C. for 15 min; spin-coat a 38 nm thick CdSe@7ZnSe/1ZnO NBQD as an NBQD light-emitting layer on an upper surface of the hole transport layer at a rate of 2,000 rpm/min, and dry at 150° C. for 15 min; spin-coat a 50 nm thick zinc oxide as an electron transport layer on an upper surface of the NBQD light-emitting layer at a rate of 300 rpm/min; deposit 100 nm thick Al as a top electrode under vacuum on an upper surface of the electron transport layer at a rate of 3 Å/s, to obtain a QDLED.

Figure 3:
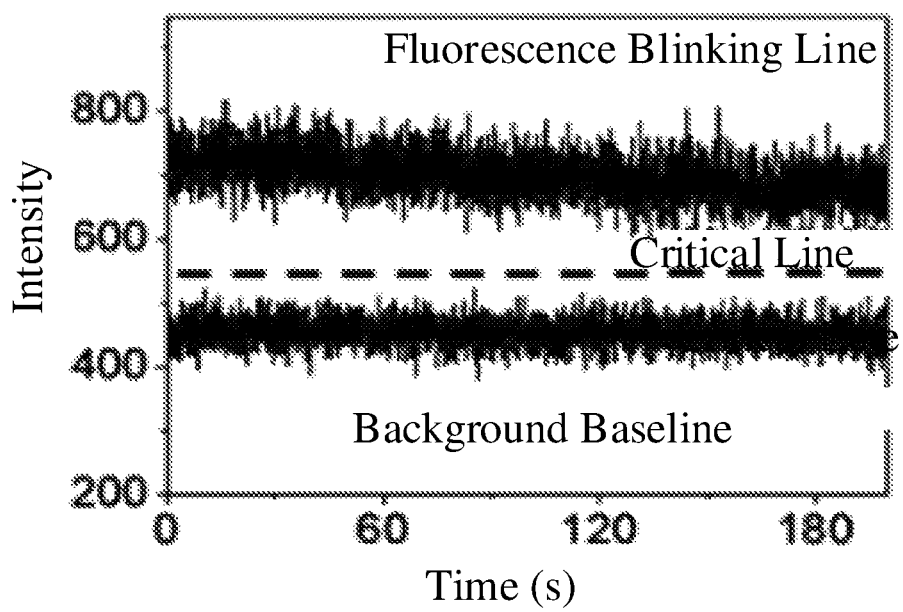
FIG. 3 is a diagram showing a fluorescent test result of a QDLED prepared in Embodiment 2.

FIG. 3 is a diagram showing a fluorescent test result the QDLED. It can be seen from the figure that a middle dashed line is a critical line of a fluorescence blinking bright state line and the substrate, and the fluorescence blinking line is basically above the critical line. This indicates that the QDLED obtained in this embodiment has a stable fluorescence property.

Figure 4:
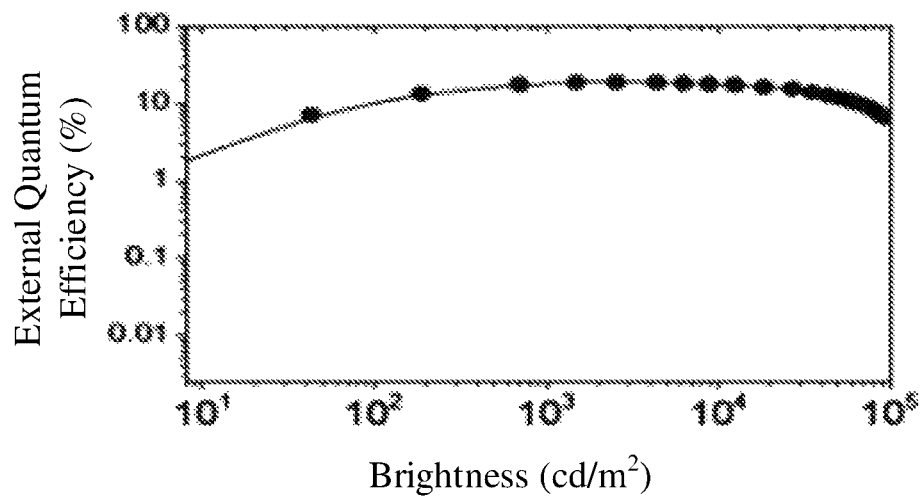
FIG. 4 is a diagram showing a green fluorescence property of a QDLED prepared in Embodiment 2.

FIG. 4 is a diagram showing a fluorescence property of the QDLED. It can be seen from the figure that the maximum green brightness of the QDLED is 100,000 cd/m², the maximum external quantum efficiency is 19%, and when the external quantum efficiency is above 17%, the corresponding brightness is 700-18,000 cd/m².

Embodiment 3

Preparation of $Cd_{0.5}Zn_{0.5}Se@6ZnSe-1ZnS$:

add a $2\times10^{-7}$ mmol $Cd_{0.5}Zn_{0.5}Se$ QD with a particle size of 3.5 nm to a mixed solution of 6 mL octadecene and 6 mL oleylamine to obtain a $Cd_{0.5}Zn_{0.5}Se$ QD solution;

increase the temperature to 310° C. at a rate of 18° C./min under nitrogen protection; add 6 mL of liquid paraffin solution composed of zinc oleate and selenium powder dropwise to the $Cd_{0.5}Zn_{0.5}Se$ QD solution at a rate of 4 mL/h, where the zinc oleate has a concentration of 0.1 mmol/mL, and zinc in the zinc oleate and the selenium powder have a molar ratio of 1:1; perform a reaction for 1 h after the dropwise addition, to obtain an intermediate solution; and add 2 mL of octadecene solution composed of zinc oleate with a concentration of 0.1 mmol/mL and 1 mL of octadecene solution composed of octadecancthiol to the intermediate solution at a rate of 3 mL/h; perform a reaction for 2 h after the dropwise addition, to obtain an NBQD solution.

Preparation of QDLED:

treat a cleaned ITO glass substrate with an UV-ozone treatment device for 15 min; spin-coat 40 nm thick poly(3, 4-ethylenedioxythiophene): polystyrene sulfonate as a hole injection layer on an upper surface of the ITO glass substrate at a rate of 300 rpm/min, and dry at 150° C. for 15 min; spin-coat 30 nm thick poly[(9,9-dioctylfluorene-2,7-diyl)-co-(4,4'-(N-(4-sec-butylphenyl)diphenylamine] as a hole transport layer on an upper surface of the hole injection layer at a rate of 300 rpm/min, and dry at 150° C. for 15 min; spin-coat a 36 nm thick $Cd_{0.5}Zn_{0.5}Se@6ZnSe-1ZnS$ (0<m<1) NBQD as a QD light-emitting layer on an upper surface of the hole transport layer at a rate of 2,000 rpm/min, and dry at 150° C. for 15 min; spin-coat a 55 nm thick zinc oxide as an electron transport layer on an upper surface of the NBQD light-emitting layer at a rate of 3,000 rpm/min; deposit 100 nm thick Al as a top electrode under vacuum on an upper surface of the electron transport layer at a rate of 3 Å/s, to obtain a QDLED.

A fluorescence test of the QDLED indicates that the QDLED obtained in this embodiment has a stable fluorescence property. The maximum red brightness of the QDLED is 320,000 cd/m$^2$, the maximum external quantum efficiency is 20.6%, and when the external quantum efficiency is above 18%, the corresponding brightness is 3,000-80,000 cd/m$^2$.

Embodiment 4

Preparation of $Cd_{0.2}Zn_{0.8}Se@6ZnSe-1ZnS$:

add a 2×10$^{-7}$ mmol $Cd_{0.2}Zn_{0.8}Se$ QD with a particle size of 3.5 nm to a mixed solution of 6 mL octadecene and 6 mL oleylamine to obtain a $Cd_{0.2}Zn_{0.8}Se$ QD solution;

increase the temperature to 310° C. at a rate of 18° C./min under nitrogen protection; add 6 mL of liquid paraffin solution composed of zinc oleate and selenium powder dropwise to the $Cd_{0.2}Zn_{0.8}Se$ QD solution at a rate of 4 mL/h, where the zinc oleate has a concentration of 0.1 mmol/mL, and zinc in the zinc oleate and the selenium powder have a molar ratio of 1:1; perform a reaction for 1 h after the dropwise addition, to obtain an intermediate solution; and add 2 mL of octadecene solution composed of zinc oleate with a concentration of 0.1 mmol/mL and 1 mL of octadecene solution composed of octadecanethiol to the intermediate solution at a rate of 3 mL/h; perform a reaction for 2 h after the dropwise addition, to obtain an NBQD solution.

Preparation of QDLED:

treat a cleaned ITO glass substrate with an UV-ozone treatment device for 15 min; spin-coat 40 nm thick poly(3, 4-ethylenedioxythiophene): polystyrene sulfonate as a hole injection layer on an upper surface of the ITO glass substrate at a rate of 300 rpm/min, and dry at 150° C. for 15 min; spin-coat 30 nm thick poly[(9,9-dioctylfluorene-2,7-diyl)-co-(4,4'-(N-(4-sec-butylphenyl)diphenylamine] as a hole transport layer on an upper surface of the hole injection layer at a rate of 300 rpm/min, and dry at 150° C. for 15 min; spin-coat a 36 nm thick $Cd_{0.2}Zn_{0.8}Se@6ZnSe-1ZnS$ (0<m<1) NBQD as a QD light-emitting layer on an upper surface of the hole transport layer at a rate of 2,000 rpm/min, and dry at 150° C. for 15 min; spin-coat a 55 nm thick zinc oxide as an electron transport layer on an upper surface of the NBQD light-emitting layer at a rate of 3,000 rpm/min; deposit 100 nm thick Al as a top electrode under vacuum on an upper surface of the electron transport layer at a rate of 3 Å/s, to obtain a QDLED.

A fluorescence test of the QDLED indicates that the QDLED obtained in this embodiment has a stable fluorescence property. The maximum green brightness of the QDLED is 530,000 cd/m$^2$, the maximum external quantum efficiency is 22.6%, and when the external quantum efficiency is above 20%, the corresponding brightness is 5,000-110,000 cd/m$^2$.

The above embodiments indicate that the LED has a stable fluorescence property.

The foregoing descriptions are only preferred implementation manners of one or more embodiments in the present invention. It should be noted that for a person of ordinary skill in the art, several improvements and modifications may further be made without departing from the principle of the present invention. These improvements and modifications should also be deemed as falling within the protection scope of the present invention.

What is claimed is:

1. A preparation method of a non-blinking quantum dot (NBQD) comprising:
   a core,
   an inner shell layer covering a surface of the core, and
   an outer shell layer covering a surface of the inner shell layer, wherein the core is formed of CdSe or $Cd_mZn_{1-m}Se$, 0<m<1,
   wherein the inner shell layer is formed of ZnSe and the outer shell layer is formed of ZnS or ZnO,
   the method comprising the following steps:
   providing a dispersion agent of a core material, a dispersion agent of a material source of the inner shell layer and a dispersion agent of a material source of the outer shell layer, wherein the core material comprises CdSe or $Cd_mZn_{1-m}Se$, 0<m<1; wherein the material source of the inner shell layer is a mixture of a zinc source and a selenium source; and wherein the material source of the outer shell layer is a mixture of a zinc source and a sulfur source, or a zinc oxide source;
   adding the dispersion agent of the material source of the inner shell layer dropwise to the dispersion agent of the core material at a rate of 1-20 mL/h under an anaerobic condition, so that a material of the inner shell layer is grown in situ on a surface of the core material to obtain a dispersion agent of an intermediate, wherein the intermediate comprises a core and an inner shell layer covering a surface of the core; and
   adding the dispersion agent of the material source of the outer shell layer dropwise to the dispersion agent of the intermediate at a rate of 1-20 mL/h under an anaerobic condition, so that a material of the outer shell layer is grown in situ on a surface of the intermediate, to obtain an NBQD.

2. The preparation method of the NBQD according to claim 1 wherein the core has a particle size of 2.5-6.0 nm; the inner shell layer has a thickness of 0.32-4.8 nm; and the outer shell layer has a thickness of 0.31-1.24 nm, the method comprising the following steps:
   providing a dispersion agent of a core material, a dispersion agent of a material source of the inner shell layer and a dispersion agent of a material source of the outer shell layer, wherein the core material comprises CdSe or $Cd_mZn_{1-m}Se$, 0<m<1; wherein the material source of the inner shell layer is a mixture of a zinc source and a selenium source; the material source of the outer shell layer is a mixture of a zinc source and a sulfur source, or a zinc oxide source;
   adding the dispersion agent of the material source of the inner shell layer dropwise to the dispersion agent of the core material at a rate of 1-20 mL/h under an anaerobic condition, so that a material of the inner shell layer is grown in situ on a surface of the core material to obtain a dispersion agent of an intermediate, wherein the intermediate comprises a core and an inner shell layer covering a surface of the core; and adding the dispersion agent of the material source of the outer shell layer dropwise to the dispersion agent of the intermediate at a rate of 1-20 mL/h under an anaerobic condition, so that a material of the outer shell layer is grown in situ on a surface of the intermediate, to obtain an NBQD.

3. The preparation method of the NBQD according to claim 1, wherein the NBQD core/inner shell layer/outer shell layer structure is CdSe@xZnSe-yZnS or $Cd_mZn_{1-m}Se$@xZnSe-yZnO;

wherein, x is a number of layers, 1<x<15, and y is a number of layers, 0<y<4;

the method comprising the following steps:

providing a dispersion agent of a core material, a dispersion agent of a material source of the inner shell layer and a dispersion agent of a material source of the outer shell layer, wherein the core material comprises CdSe or $Cd_mZn_{1-m}Se$, 0<m<1; wherein the material source of the inner shell layer is a mixture of a zinc source and a selenium source; and wherein the material source of the outer shell layer is a mixture of a zinc source and a sulfur source, or a zinc oxide source;

adding the dispersion agent of the material source of the inner shell layer dropwise to the dispersion agent of the core material at a rate of 1-20 mL/h under an anaerobic conditions, so that a material of the inner shell layer is grown in situ on a surface of the core material to obtain a dispersion agent of an intermediate, wherein the intermediate comprises a core and an inner shell layer covering a surface of the core; and adding the dispersion agent of the material source of the outer shell layer dropwise to the dispersion agent of the intermediate at a rate of 1-20 mL/h under an anaerobic condition, so that a material of the outer shell layer is grown in situ on a surface of the intermediate, to obtain an NBQD.

4. The preparation method of the NBQD according to claim 1 wherein the NBQD core/inner shell layer/outer shell layer structure is CdSe@xZnSe-yZnS or $Cd_mZn_{1-m}Se$@xZnSe-yZnO;

wherein, x is a number of layers, 1<x<15, and y is a number of layers, 0<y<4;

the method comprising the following steps:

providing a dispersion agent of a core material, a dispersion agent of a material source of the inner shell layer and a dispersion agent of a material source of the outer shell layer, wherein the core material comprises CdSe or $Cd_mZn_{1-m}Se$, 0<m<1; wherein the material source of the inner shell layer is a mixture of a zinc source and a selenium source; and wherein the material source of the outer shell layer is a mixture of a zinc source and a sulfur source, or a zinc oxide source;

adding the dispersion agent of the material source of the inner shell layer dropwise to the dispersion agent of the core material at a rate of 1-20 mL/h under an anaerobic condition, so that a material of the inner shell layer is grown in situ on a surface of the core material to obtain a dispersion agent of an intermediate, wherein the intermediate comprises a core and an inner shell layer covering a surface of the core; and adding the dispersion agent of the material source of the outer shell layer dropwise to the dispersion agent of the intermediate at a rate of 1-20 mL/h under an anaerobic condition, so that a material of the outer shell layer is grown in situ on a surface of the intermediate, to obtain an NBQD.

5. The preparation method according to claim 1, wherein a growth temperature of the material of the inner shell layer and the material of the outer shell layer is 240 to 350° C., and a growth time of the material of the inner shell layer and the material of the outer shell layer is 1 to 5 h.

6. The preparation method according to claim 2, wherein a growth temperature of the material of the inner shell layer and the material of the outer shell layer is 240 to 350° C., and a growth time of the material of the inner shell layer and the material of the outer shell layer is 1 to 5 h.

7. The preparation method according to claim 3 wherein a growth temperature of the material of the inner shell layer and the material of the outer shell layer is 240 to 350° C., and a growth time of the material of the inner shell layer and the material of the outer shell layer is 1 to 5 h.

8. The preparation method according to claim 4, wherein a growth temperature of the material of the inner shell layer and the material of the outer shell layer is 240 to 350° C., and a growth time of the material of the inner shell layer and the material of the outer shell layer is 1 to 5 h.

* * * * *